United States Patent
Vogt et al.

(10) Patent No.: US 6,316,980 B1
(45) Date of Patent: Nov. 13, 2001

(54) CALIBRATING DATA STROBE SIGNAL USING ADJUSTABLE DELAYS WITH FEEDBACK

(75) Inventors: Pete D. Vogt, Boulder, CO (US); John F. Zumkehr, Orange, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/607,983

(22) Filed: Jun. 30, 2000

(51) Int. Cl.$^7$ ...................................... H03H 11/26
(52) U.S. Cl. ........................ 327/273; 327/241; 713/401
(58) Field of Search ..................... 327/269–273, 327/237, 241, 243, 245, 258; 713/401, 502

(56) References Cited

U.S. PATENT DOCUMENTS 5,900,762 * 5/1999 Ramakrishnam ............ 327/277

* cited by examiner

Primary Examiner—Kenneth B. Wells
(74) Attorney, Agent, or Firm—Blakely, Sokoloff, Taylor & Zafman LLP

(57) ABSTRACT

In one embodiment of the invention, a delay circuit generates a plurality of delay strobe signals from a plurality of data strobe signals during an operational mode and a calibration signal from a reference signal by an interval during a calibration mode. The plurality of delay strobe signals clocks a plurality of data into a plurality of registers. A calibrator adjusts the interval according to a timing relationship between the calibration signal and the reference signal.

24 Claims, 4 Drawing Sheets

CALIBRATING DATA STROBE SIGNAL USING ADJUSTABLE DELAYS WITH FEEDBACK

BACKGROUND

1. Field

This invention relates to memory devices. In particular, the invention relates to data strobing.

2. General Background

Double Data Rate (DDR) memory devices use source synchronous transfers when data is read from the memory devices. The data strobe signal (DQS) is sent along with the data (DQ) to be clocked. The clocking edges of the DQS signal are coincidental with the data transition time. To capture the data in a register using the DQS signal, the DQS signal needs to be delayed to satisfy the data set-up time requirement of the register. For 100 MHz DDR devices, the required delay time is approximately 2 nsec.

Delay elements tend to have drift due to heat, aging, and other environmental factors. To adjust the delay amount, the delay elements have to be periodically calibrated. Existing techniques to calibrate the delay elements use a master/slave relationship. A master delay element is used only for calibration while a slave delay element is used only for operation. These techniques have a number of disadvantages. First, the number of delay elements is doubled, requiring more space and area. Second, the master and slave delay elements may have different characteristics due to process variation, temperature sensitivity, and voltage variations.

Therefore, there is a need to have an efficient technique to calibrate the delay elements.

BRIEF DESCRIPTION OF THE DRAWINGS

The features and advantages of the present invention will become apparent from the following detailed description of the present invention in which.

DESCRIPTION

The present invention is a method and apparatus to calibrate the delay elements to provide proper delay for clocking data into a register. The technique uses the same delay elements in both operational mode and calibration mode. During operational mode, each delay element delays the data strobe signal by a delay amount satisfying the data set-up time. During calibration mode, the delay elements are connected to form a chain which delays a reference signal by an interval approximately equal to the sum of the delays of the delay elements. When the total number of delay elements is selected such that the sum of the delays is approximately equal to one period of the reference signal, then the detection of proper calibration is reduced to adjusting the delay elements such that the edges of the reference signal and the calibration signal are coincident.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
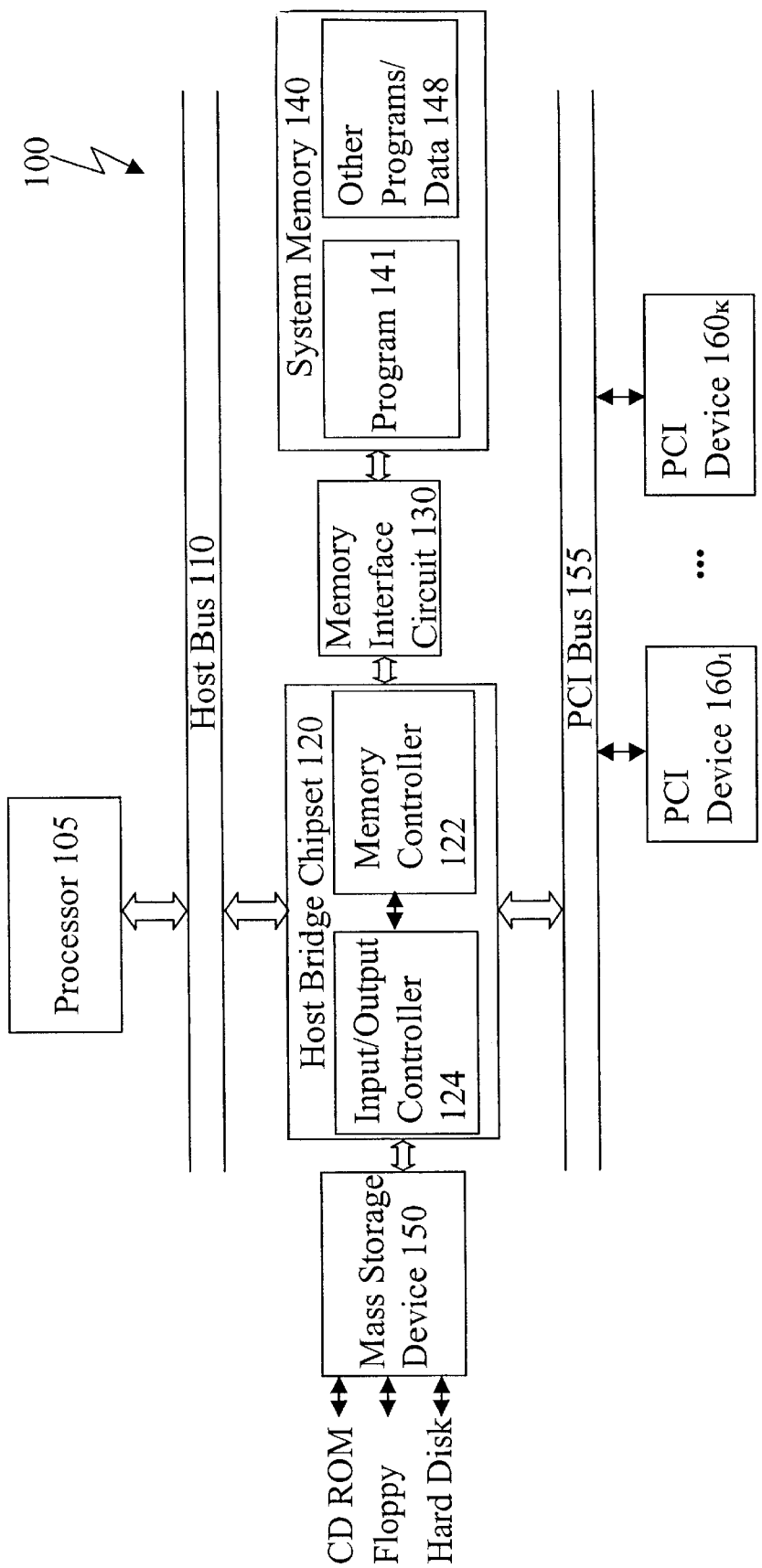
FIG. 1 is a diagram illustrating a system in which one embodiment of the invention can be practiced.

FIG. 1 is a diagram illustrating a system 100 according to one embodiment of the present invention. The system 100 includes a host processor 105, a host bus 110, a host bridge chipset 120, a memory interface circuit 130, a system memory 140, a mass storage device 150, a peripheral component interconnect (PCI) bus 155, and K PCI devices $160_1$ to $160_K$ ("K"$\geq$2).

The processor 105 represents a processing unit of any type of architecture such as a microcontroller, a digital signal processor, a state machine, or a central processing unit (CPU). The CPU may be implemented with a variety of architecture types such as a complex instruction set computers (CISC), reduced instruction set computers (RISC), very long instruction word (VLIW), or hybrid architecture. The processor 105 interfaces with the host bridge chipset 120 via the host bus 110. The host bus 110 may support single processor or multiple processors.

The host bridge chipset 120 includes a number of interface circuits to allow the host processor 105 access to the system memory 130 and the PCI bus 155. The host bride chipset includes a memory controller 122 and an input/output (I/O) controller 124. The memory controller 122 provides memory control functions. The I/O controller 140 provides interface to I/O devices via I/O ports and the PCI bus 155. The I/O ports may allow interface to I/O devices such as audio codec, modem codec, and universal serial bus (USB) devices. The memory interface circuit 130 provides interface between the system memory 140 and the memory controller 122. The system memory 140 represents one or more mechanisms for storing information. For example, the system memory 140 may include non-volatile or volatile memories. Examples of these memories include flash memory, read only memory (ROM), or random access memory (RAM). The system memory 140 may contain a program 141 and other programs and data 148. Of course, the system memory 140 preferably contains additional software (not shown), which is not necessary for understanding the invention. The mass storage device 150 includes CD ROM, floppy diskettes, and hard drives. The mass storage device 150 provides access to computer readable media that contain program code to perform designated functions.

The PCI devices $160_1$ to $160_K$ are devices to perform dedicated or general purpose tasks. Examples of PCI devices include direct memory access controller (DMAC), network interface, and media interface devices. The network interface connects to communication networks such as the Internet. The Internet provides access to on-line service providers, Web browsers, and other network channels. The media interface provides access to audio and video devices.

In one embodiment of the present invention, the system memory 140 includes double data rate synchronous dynamic random access memories (DDR SDRAM). The DDR SDRAM uses a double data rate architecture to achieve high-speed operation. The double data rate architecture is essentially a 2n-prefetch architecture with an interface designed to transfer two data words per clock cycle at the I/O pins. In a typical DDR SDRAM, a bi-directional data strobe (DQS) signal is transmitted externally, along with the data (DQ) signal, for use in data capture at the receiver. The DQS signal is a strobe transmitted by the DDR SDRAM during a read cycle and by the memory controller, e.g., the memory controller 122 (FIG. 1), during a write cycle. The DQS signal is edge-aligned with the DQ signal for read cycles and center-aligned with the DQ signal for write cycles. To simplify the discussion, the memory interface circuit 130 is directed mainly to the read cycle where the timing to clock the read data by the DQS signal is critical.

Figure 2:
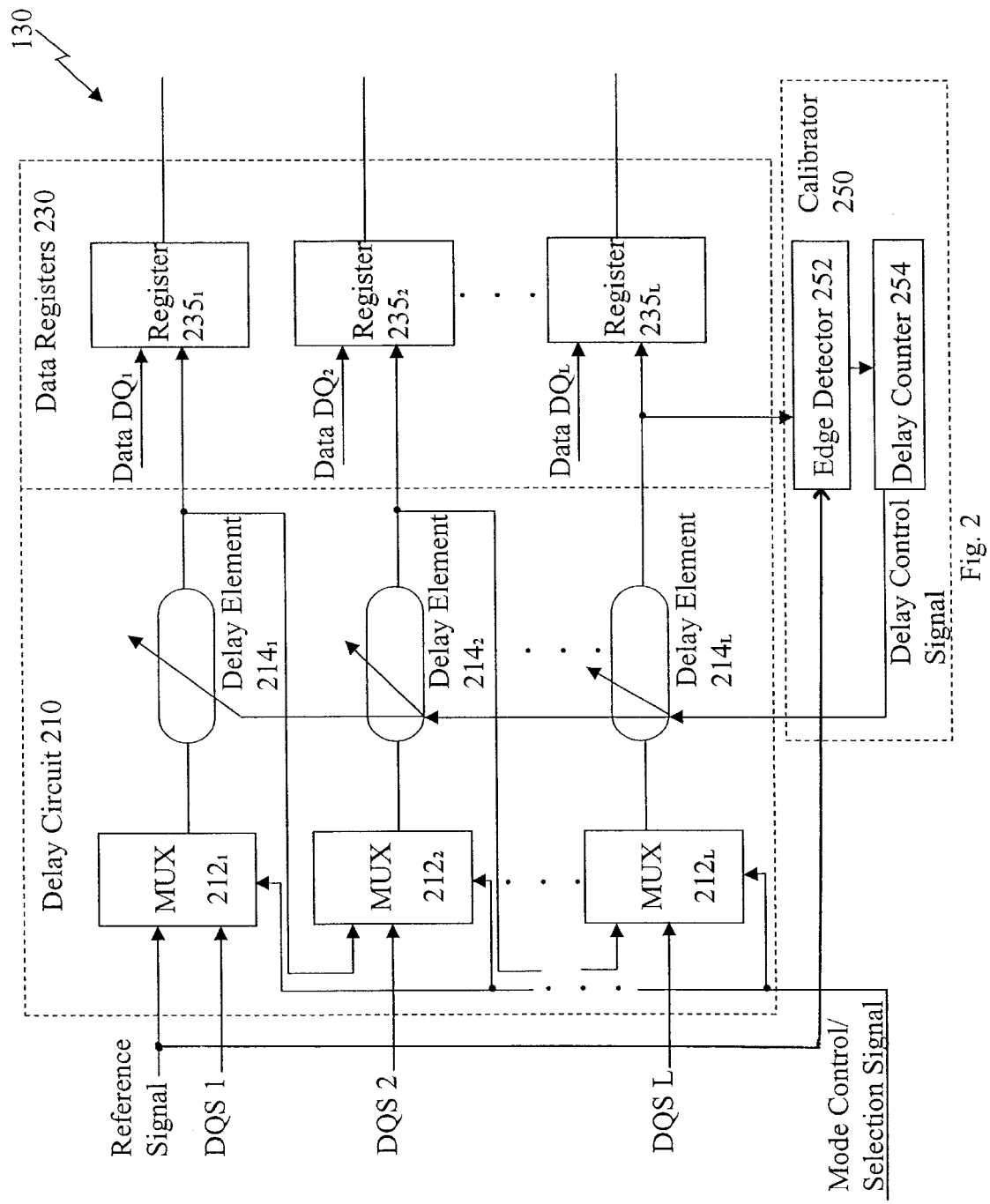
FIG. 2 is a diagram illustrating a memory interface circuit shown in FIG. 1 according to one embodiment of the invention.

FIG. 2 is a diagram illustrating the memory interface circuit 130 shown in FIG. 1 according to one embodiment of the invention. The memory interface circuit 130 is used during the read cycle to store the read data from the memory into registers or flip-flops. The memory interface circuit 130 includes a delay circuit 210, a data register 230, and a calibrator 250.

The delay circuit 210 includes L multiplexers $212_1$ to $212_L$ and L delay elements $214_1$ to $214_L$ ("L"≧2). The delay circuit 210 generates L delay strobe signals from L data strobe (DQS) signals during an operational mode and a calibration signal from a reference signal by an interval during a calibration mode. The L delay strobe signals clocking L data (DQ) into the data registers 230. The reference signal is a stable clock signal having the same frequency as the DQS signals. In one embodiment, the reference signal is a 100 MHz signal having a period of 10 nsec.

The multiplexers $212_1$ to $212_L$ receive a mode control signal to select one of the operational mode and the calibration mode. For DDR SDRAM, the mode control selects the operational mode when the memory device is in use, e.g., in read cycle, and the mode control selects the calibration mode when the memory device is not in a read cycle, e.g., refresh or write cycle. Each of the L multiplexers receives the DQS signal from the corresponding memory device and a cascading signal. For the multiplexer $212_1$, the cascading signal is the reference signal. For the remaining multiplexers $212_2$ to $212_L$, the cascading signal is the output signal from the previous delay element $212_1$ to $212_{L-1}$, respectively.

The L delay elements $214_1$ to $214_L$ are connected to the L multiplexers $212_1$ to $212_L$, respectively. Each of the L delay elements $214_1$ to $214_L$ has an adjustable delay to provide L delay strobe signals in the operational mode and a calibration signal in the calibration mode.

The data registers 230 include L registers or flip-flops $235_1$ to $235_L$ to store the data read from the memory devices in the system memory 140. The clock inputs of the L registers $235_1$ to $235_L$ are connected to the outputs of the L delay elements. When the multiplexers $212_1$ to $212_L$ are selected in the operational mode, the L DQS signals go through the L multiplexers $212_1$ to $212_L$ to become the L delay strobe signals which are used to clock the corresponding DQ signals. When the multiplexers $212_1$ to $212_L$ are selected in the calibration mode, the L delay elements $214_1$ to $214_L$ are connected in cascade through the L multiplexers $212_1$ to $212_L$ to form a chain. The calibration signal is the output of the last delay element $214_L$ in the chain. The calibration signal therefore is the reference signal delayed by an interval equal to the sum of the delays of the L delay elements $214_1$ to $214_L$ and the propagation delays of the L multiplexers $212_1$ to $212_L$.

The calibrator 250 is used in the calibration mode to adjust the interval according to a timing relationship between the calibration signal and the reference signal. Since the number of the delay elements $214_1$ to $214_L$ is known in advance, this timing relationship can be determined in advance. This timing relationship is used to determine the proper value for the control signal to adjust the delay of each of the L delay elements $214_1$ to $214_L$.

The calibrator 250 includes an edge detector 252 and a delay counter 254. The edge detector 252 provides a phase difference between edges of the reference signal and the calibration signal. This phase difference corresponds to the timing relationship between the two signals. The delay counter 254 generates a delay control signal based on the phase difference. This delay control signal is connected to the control input of each of the L delay elements $214_1$ to $214_L$ to adjust its delay in a feedback manner. The delay counter 254 increments or decrements a count depending on whether the reference signal leads or lags the calibration signal. This count is the delay control signal.

When the timing relationship between the reference signal and the calibration signal is such that the phase difference between the two signals is zero, the delay counter 254 can be designed to lock onto a stable value, indicating the delay elements $214_1$ to $214_L$ have been properly calibrated. The phase difference between the two signals is zero when the calibration signal lags the reference signal by an exact full period of the reference signal. In this case, the edges of the two signals are coincident. This is achieved when the number of the delay elements $214_1$ to $214_L$ is such that the total sum of the delay is equal to one period of the reference signal. For example, suppose the desired delay for each delay element is 2 nsec and the reference signal has a frequency of 100 MHz having a period of 10 nsec. Then if L=5, the sum of the delays is equal to 10 nsec. By selecting the proper number of delay elements $214_1$ to $214_L$, it is therefore possible for the edge detector 252 to detect coincident edges. Therefore, the calibration process is repeated until the two edges are coincident. When this occurs, each of the delay elements essentially has been adjusted to have a proper delay for each of the DQS signals.

Figure 3:
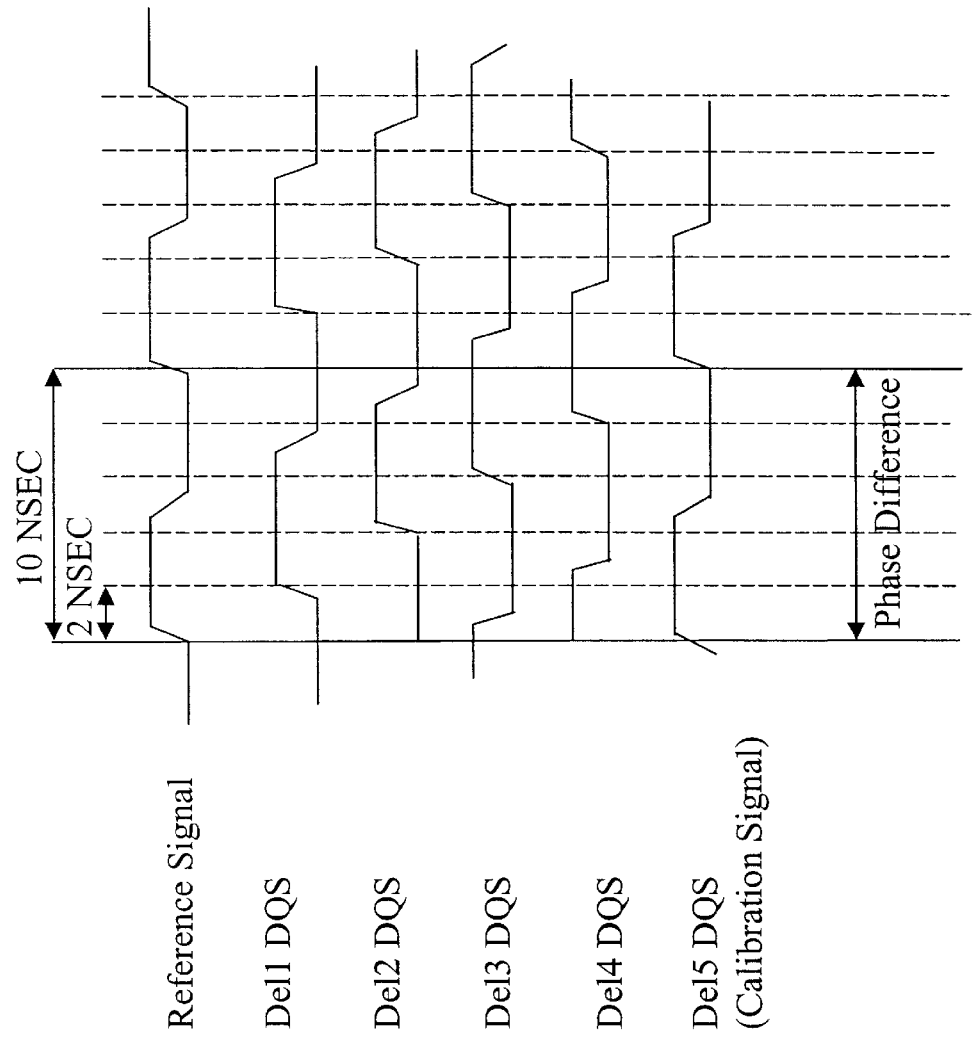
FIG. 3 is a timing diagram illustrating a calibration signal according to one embodiment of the invention.

FIG. 3 is a timing diagram illustrating a calibration signal according to one embodiment of the invention. The timing diagram shows five signals DEL1DQS, DEL2DQS, DEL3DQS, DEL4DQS, and DEL5DQS which are the outputs of the 5 delay elements $214_1$ through $214_5$, respectively.

The reference signal has a frequency of 100 MHz and a period of 10 nsec. The DEL5DQS signal corresponds to the calibration signal. Assume that the desired delay for each delay element is 2 nsec in order to meet the data setup time. Since there are 5 delay elements in this example, the locked timing relationship is when the calibration signal is delayed by an interval equal to the period of the reference signal, or 10 nsec.

The calibration is terminated when the edges of the reference signal and the calibration signal coincide. At this time, each of the five signals DEL1DQS, DEL2DQS, DEL3DQS, DEL4DQS, and DEL5DQS is delayed from the previous signal by an average amount of 2 nsec, i.e., the DEL1DQS is delayed from the reference signal by 2 nsec, the DEL2DQS is delayed from the DEL1DQS by 2 nsec., etc. When the mode control signal selects the operational mode, each delay element has been properly calibrated to provide a 2-nsec delay.

Figure 4:
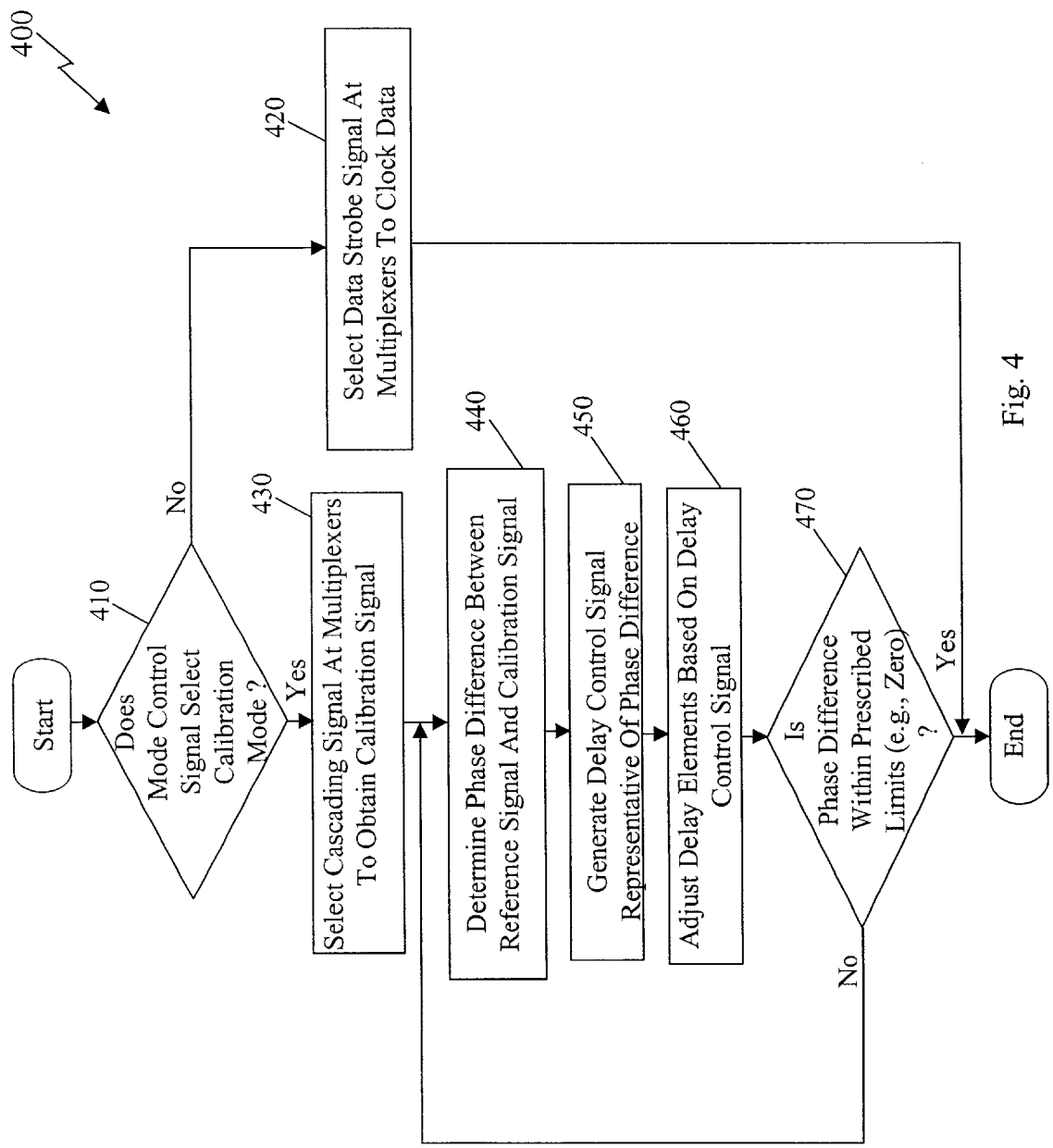
FIG. 4 is a flowchart illustrating a calibration process according to one embodiment of the invention.

FIG. 4 is a flowchart illustrating a calibration process according to one embodiment of the invention.

Upon START, the process 400 determines if the mode control signal corresponds to the operational mode or the calibration mode (Block 410). If the mode control signal selects the operational mode, the process 400 selects the data strobe signals at the multiplexers to clock the data onto the registers (Block 420) and is then terminated. If the mode control signal selects the calibration mode, the process 400 selects the cascading signals at the multiplexers to obtain the calibration signal coming out of the last delay element in the chain (Block 430). Then the process 400 determines the phase difference between the reference signal and the calibration signal be measuring the difference between the edges of the two signals (Block 440).

Next, the process 400 generates a delay control signal representative of the phase difference (Block 450). Then, the process 400 adjusts the delay elements based on the delay control signal (Block 460). Then, the process 400 determines if the phase difference is within the prescribed limits (Block 470). If NO, the process 400 returns to block 440 to repeat the process. Otherwise, the delay elements have been properly calibrated and the process 400 is terminated.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a delay circuit to generate a plurality of delay strobe signals from a plurality of data strobe signals during an operational mode and a calibration signal from a reference signal by an interval during a calibration mode, the plurality of delay strobe signals clocking a plurality of data into a plurality of registers; and
   a calibrator coupled to the delay circuit to adjust the interval according to a timing relationship between the calibration signal and the reference signal.

2. The apparatus of claim 1 wherein the delay circuit comprises:
   a plurality of delay elements, each having an adjustable delay, to provide the plurality of delay strobe signals in the operational mode and the calibration signal in the calibration mode from the reference signal via the plurality of delay elements; and
   a plurality of multiplexers coupled to the plurality of delay elements, the plurality of multiplexers including a first multiplexer and one less than plurality of multiplexers, each of the plurality of multiplexers selecting one of a corresponding data strobe signal from the plurality of data strobe signals and a cascading signal, the cascading signal being the reference signal for the first multiplexer, the cascading signal being a delay output signal from a previous delay element for the one less than plurality of multiplexers.

3. The apparatus of claim 2 wherein the interval is dependent on a sum of the delays of the plurality of delay elements.

4. The apparatus of claim 2 wherein the calibrator comprises:
   an edge detector to provide a phase difference between edges of the reference signal and the calibration signal, the phase difference corresponding to the interval; and
   a delay counter coupled to the edge detector to generate a delay control signal based on the phase difference, the delay control signal adjusting the plurality of delay elements.

5. The apparatus of claim 4 wherein the timing relationship corresponds to a coincidence of edges of the reference signal and the calibration signal when the phase difference is approximately equal to zero.

6. The apparatus of claim 1 wherein the plurality of data are provided in a read mode of a memory device.

7. The apparatus of claim 6 wherein the memory device is a double data rate (DDR) random access memory (RAM).

8. The apparatus of claim 7 wherein the calibration mode occurs during one of a refresh time and a write cycle time of the DDR RAM.

9. A method comprising:
   generating a plurality of delay strobe signals from a plurality of data strobe signals during an operational mode and a calibration signal from a reference signal by an interval during a calibration mode, the plurality of delay strobe signals clocking a plurality of data into a plurality of registers; and
   adjusting the interval according to a timing relationship between the calibration signal and the reference signal.

10. The method of claim 9 wherein generating the plurality of delay strobe signals comprises:
    providing the plurality of delay strobe signals in the operational mode and the calibration signal in the calibration mode from the reference signal via the plurality of delay elements; and
    selecting one of a corresponding data strobe signal from the plurality of data strobe signals and a cascading signal by plurality of multiplexers, the cascading signal being the reference signal for a first multiplexer, the cascading signal being a delay output signal from a previous delay element for one less than plurality of multiplexers.

11. The method of claim 10 wherein the interval is dependent on a sum of the delays of the plurality of delay elements.

12. The method of claim 10 wherein the step of adjusting comprises:
    providing a phase difference between edges of the reference signal and the calibration signal, the phase difference corresponding to the interval; and
    generating a delay control signal based on the phase difference, the delay control signal adjusting the plurality of delay elements.

13. The method of claim 12 wherein the timing relationship corresponds to a coincidence of edges of the reference signal and the calibration signal when the phase difference is approximately equal to zero.

14. The method of claim 9 wherein the plurality of data are provided in a read mode of a memory device.

15. The method of claim 14 wherein the memory device is a double data rate (DDR) random access memory (RAM).

16. The method of claim 15 wherein the calibration mode occurs during one of a refresh time and a write cycle time of the DDR RAM.

17. A circuit comprising:
    a plurality of registers to receive a plurality of data; and
    a delay controller coupled to the plurality of registers, the delay controller comprising:
    a delay circuit to generate a plurality of delay strobe signals from a plurality of data strobe signals during an operational mode and a calibration signal from a reference signal by an interval during a calibration mode, the plurality of delay strobe signals clocking the plurality of data into the plurality of registers, and
    a calibrator coupled to the delay circuit to adjust the interval according to a timing relationship between the calibration signal and the reference signal.

18. The circuit of claim 17 wherein the delay circuit comprises:
    a plurality of delay elements, each having an adjustable delay, to provide the plurality of delay strobe signals in the operational mode and the calibration signal in the calibration mode from the reference signal via the plurality of delay elements; and a plurality of multiplexers coupled to the plurality of delay elements, the plurality of multiplexers including a first multiplexer and one less than plurality of multiplexers, each of the plurality of multiplexers selecting one of a corresponding data strobe signal from the plurality of data strobe signals and a cascading signal, the cascading signal being the reference signal for the first multiplexer, the cascading signal being a delay output signal from a previous delay element for the one less than plurality of multiplexers.

19. The circuit of claim 18 wherein the interval is dependent on a sum of the delays of the plurality of delay elements.

20. The circuit of claim 18 wherein the calibrator comprises:

an edge detector to provide a phase difference between edges of the reference signal and the calibration signal, the phase difference corresponding to the interval; and a delay counter coupled to the edge detector to generate a delay control signal based on the phase difference, the delay control signal adjusting the plurality of delay elements.

21. The circuit of claim 20 wherein the timing relationship corresponds to a coincidence of edges of the reference signal and the calibration signal when the phase difference is approximately equal to zero.

22. The circuit of claim 17 wherein the plurality of data are provided in a read mode of a memory device.

23. The circuit of claim 22 wherein the memory device is a double data rate (DDR) random access memory (RAM).

24. The circuit of claim 23 wherein the calibration mode occurs during one of a refresh time and a write cycle time of the DDR RAM.

* * * * *